United States Patent
Zhijian et al.

(10) Patent No.: US 7,192,863 B2
(45) Date of Patent: Mar. 20, 2007

(54) METHOD OF ELIMINATING ETCH RIDGES IN A DUAL DAMASCENE PROCESS

(75) Inventors: Lu Zhijian, Plano, TX (US); Qi-Zhong Hong, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/903,711

(22) Filed: Jul. 30, 2004

(65) Prior Publication Data

US 2006/0024956 A1 Feb. 2, 2006

(51) Int. Cl.
*H01L 21/4763* (2006.01)

(52) U.S. Cl. ............... 438/637; 438/638; 257/E21.579

(58) Field of Classification Search ............... 438/637, 438/701, 702; 257/E21.579
See application file for complete search history.

(56) References Cited

U.S. PATENT DOCUMENTS

| | | |
|---|---|---|
| 6,410,426 B1 | 6/2002 | Xing et al. |
| 6,429,105 B1 | 8/2002 | Kunikiyo |
| 6,548,705 B1 | 4/2003 | Bishop et al. |
| 6,576,550 B1 | 6/2003 | Brase et al. |
| 6,589,881 B2 | 7/2003 | Huang et al. |
| 6,617,257 B2 | 9/2003 | Ni et al. |
| 6,642,153 B1 | 11/2003 | Chang et al. |
| 6,660,630 B1 | 12/2003 | Chang et al. |
| 6,680,252 B2 | 1/2004 | Chen et al. |
| 6,723,636 B1 | 4/2004 | Russell et al. |
| 6,855,629 B2* | 2/2005 | Kim et al. ............... 438/637 |
| 2003/0137055 A1* | 7/2003 | Trivedi ............... 257/774 |
| 2004/0038540 A1 | 2/2004 | Li et al. |
| 2004/0067441 A1* | 4/2004 | Shao et al. ............... 430/281.1 |
| 2005/0003656 A1* | 1/2005 | Chung ............... 438/639 |
| 2005/0191840 A1* | 9/2005 | Ho et al. ............... 438/618 |

* cited by examiner

*Primary Examiner*—Caridad M. Everhart
(74) *Attorney, Agent, or Firm*—Jacqueline J. Garner; W. James Brady, III; Frederick J. Telecky, Jr.

(57) ABSTRACT

A dual damascene process employs a via fill material (38) with an etch rate that is within 60% of an etch rate that an underlying dielectric layer (34) etches for a given dielectric etch chemistry in which a trench (48) and via (50) are being formed. In one embodiment, an organic via fill material plug (40) is employed in conjunction with a bottom anti-reflective coating (BARC) material layer (42). Both the organic via fill material plug (40) and the BARC material layer (42) are selected to have a material with an etch rate that within 60% of an etch rate that an underlying dielectric layer (34) etches for a given dielectric etch chemistry in which the trench (48) and via (50) are formed.

19 Claims, 3 Drawing Sheets

METHOD OF ELIMINATING ETCH RIDGES IN A DUAL DAMASCENE PROCESS

TECHNICAL FIELD

The present invention relates to semiconductor devices and, more particularly, to a method of eliminating etch ridges in a dual damascene structure.

BACKGROUND OF THE INVENTION

In the semiconductor industry, there is a continuing trend toward higher device densities. To achieve these high densities, there has been and continues to be efforts toward scaling down device dimensions to submicron levels (e.g., below 0.35 microns) on semiconductor substrates. In order to accomplish such high device packing density, smaller and smaller features sizes are required. This may include the width and spacing of metal interconnecting lines, spacing and diameter of contact holes, and the surface geometry such as corners and edges of various features.

Single damascene is a technique developed to address disadvantages (e.g., poor metal step coverage, residual metal shorts, low yields, uncertain reliability, and poor ULSI integration extendability) associated with traditional etch back methods. Damascene basically involves the formation of a trench which is filled with a metal. Thus, damascene differs from traditional etch back methods which involve building up a metal wiring layer and filling the interwiring spaces with a dielectric material.

An improvement to single damascene is dual damascene which involves substantially simultaneous formation of a conductive via and conductive wiring. The dual damascene technique requires less manipulative steps than the single damascene technique and eliminates the interface between the conductive via and conductive wiring which is typically formed by the single damascene technique. In very and ultra large scale integration (VLSI and ULSI) circuits, an insulating or dielectric material, such as silicon oxide, of the semiconductor device in the dual damascene process is patterned with several thousand openings for the conductive lines and vias which are filled with metal, such as aluminum, and serve to interconnect active and/or passive elements of the integrated circuit.

In a via-first dual damascene process, vias are first anisotropically etched in a dielectric by conventional photolithographic and etching techniques. A second anistropically etched opening referred to as a trench line is then formed in the dielectric according to a second photolithographic patterning process overlying an encompassing the via opening. The via opening and the trench line together makeup the dual damascene structure which is subsequently filled with a conductive material (e.g., a metal).

During the formation of the trench line, a via fill material is employed to protect the bottom surface of the via. The via fill is employed as a stop material layer to protect the bottom surface of the via from further etching. The via fill is also employed as a planarizing layer for subsequent trench patterning. The via fill can be employed alone or in conjunction with a bottom anti-reflective coating (BARC) material layer. However, fences or ridges can form on the outer perimeter of the via caused by residual via fill material and/or BARC material during the etching of the trench line, since the dielectric material etches substantially faster (e.g., at least twice as fast) than the fill material and/or BARC material.

For example, FIG. 1 illustrates a dual damascene structure 10 at a stage in manufacturing formed by a via-first dual damascene process where a via opening 18 is formed in a dielectric layer 14 disposed over a substrate 12, followed by a formation of a trench opening 20 overlying and encompassing the via opening. Residual fences or etch ridges 22 remain around the outer periphery of the via opening 18 as a result the dielectric layer 14 etching substantially faster than a via fill material (not shown) and/or a BARC material layer 16. These ridges/fences 22 present serious yield/reliability issues, particularly in submicron processes.

SUMMARY OF THE INVENTION

The present invention relates generally to the formation of interconnects employing a via-first dual damascene process. The via-first dual damascene process employs a via fill material with an etch rate that is within 60% of an etch rate of an underlying dielectric layer for a given dielectric etch chemistry in which the trench and via are being formed. The employment of a via fill material with an etch rate that is is within 60% of an etch rate of an underlying dielectric layer for a given dielectric etch chemistry substantially prevents the formation of etch ridges or fences. In one aspect of the invention, the via-first dual damascene process employs a via fill material with an etch rate that is within 20% of an etch rate of an underlying dielectric layer for a given dielectric etch chemistry.

One aspect of the invention relates to a method for forming a semiconductor structure. The method comprises forming a first opening in a dielectric layer, filling the first opening with a fill material, and etching a second opening in the dielectric layer overlying the first opening with a given dielectric etch chemistry, wherein the fill material has an etch rate that is within 60% of an etch rate of an underlying dielectric layer for a given dielectric etch chemistry.

Another aspect of the invention relates to a method for forming a dual damascene structure. The method comprise forming a via in a dielectric layer, filling the via with an organic fill material layer, and etching back the organic via fill material to form an organic via fill material plug that resides in the via below a top surface of the dielectric layer. The method further comprises depositing a bottom anti-reflective coating (BARC) layer over the dielectric layer that fills the via above the organic via fill material plug, and anisotropically etching a trench in the dielectric layer overlying the via with a given dielectric etch chemistry, wherein the fill material has that is within 60% of an etch rate of an underlying dielectric layer for a given dielectric etch chemistry.

Yet another aspect of the present invention relates to a method for forming a via-first dual damascene structure. The method comprises forming a via in a dielectric layer comprised of one of silicon oxide (SiO), silicon dioxide ($SiO_2$), silicon nitride ($Si_3N_4$), (SiN), silicon carbon (SiC), oxygen silicon glass (OSG), black diamond (BD-2) and silicon carbon monoxide (SiCO), filling the via with an organic fill material layer, etching back the organic via fill material to form an organic via fill material plug that resides in the via below a top surface of the dielectric layer, and depositing (e.g., spin coating) a bottom anti-reflective coating (BARC) layer over the dielectric layer that fills the via above the organic via fill material plug. The method further comprise etching a trench in the dielectric layer overlying the via with an etch chemistry comprising an anisotropic etch with a plasma gas mixture of carbon tetrafluoride ($CF_4$), carbon trifluoride ($CF_3$), octafluorocyclobutane ($C_4F_8$) and oxygen ($O_2$), wherein the organic fill material and the BARC layer have an etch rate that that is within 60% of an etch rate of an underlying dielectric layer for a given dielectric etch chemistry to provide a via-first dual damascene structure substantially free of etch ridges.

BRIEF DESCRIPTION OF THE DRAWINGS

The foregoing and other aspects of the present invention will become apparent to those skilled in the art to which the present invention relates upon reading the following description with reference to the accompanying drawings.

DETAILED DESCRIPTION

The present invention relates generally to the formation of interconnects employing a via-first dual damascene process. The via-first dual damascene process employs a via fill material that etches at an etch rate that is within 60% of an etch rate in which an underlying dielectric layer etches for a given dielectric etch chemistry in which the trench and via are being formed. In one aspect of the invention, the via fill material etches at an etch rate that is within 20% of an etch rate in which an underlying dielectric layer etches for a given dielectric etch chemistry in which the trench and via are being formed. The employment of a via fill material with an etch rate that is as substantially (e.g., within 60%, within 20%) as fast as an etch rate of an underlying dielectric layer for a given dielectric etch chemistry substantially prevents the formation of etch ridges or fences. The present invention can be employed in 65 nm, 90 nm and 130 nm nodes.

In one aspect of the invention, an organic via fill material plug is employed in conjunction with a BARC material layer. Both the organic via fill material plug and the BARC material layer are selected to have a material with an etch rate that is as substantially as fast (e.g., within 60%, within 20%) as an etch rate of an underlying dielectric layer for a given dielectric etch chemistry, in which the trench and via are formed. Planarization of the via fill material is improved by employing both an organic via fill material plug deposition followed by a BARC material layer deposition.

Although the method of the present invention is explained by exemplary reference to the formation of a via-first method of formation of a dual damascene structure in a multi-level semiconductor device, it will be appreciated that the method of the present invention is equally applicable to the anisotropic etching of other structures where one anisotropically etched opening is formed overlying and at least partially encompassing one or more other anisotropically etched openings where edge ridges or fences that remain on features following a photolithographic patterning process and/or an anisotropic etching process is substantially prevented by providing an opening fill material that etches at an etch rate that is within one of 60% and 20% of an etch rate of an underlying dielectric material layer(s) in which the overlying opening is formed.

Although only a single via and trench are illustrated in the Figures, it is to be appreciated that the present invention can be used to form any number of trench and via structures in a dielectric layer(s) in addition to the single via and trench. It should also be noted that a via is used in the present invention to describe a structure formed in a dielectric layer in which a contact is to be formed, and a trench is used to describe a structure formed in the dielectric layer in which a metal interconnect line is be formed.

Figure 1:
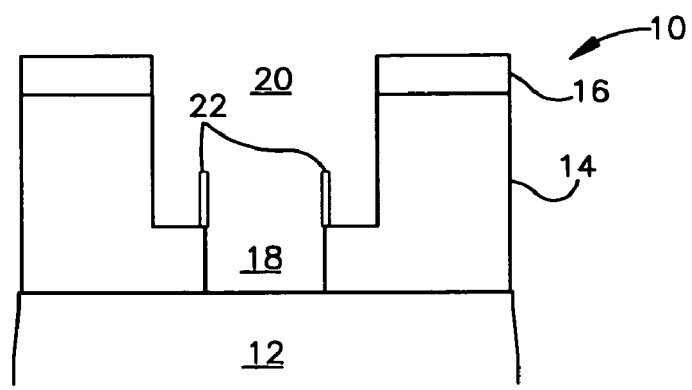
FIG. 1 illustrates a conventional dual damascene structure with etch ridges or fences.
Figure 2:
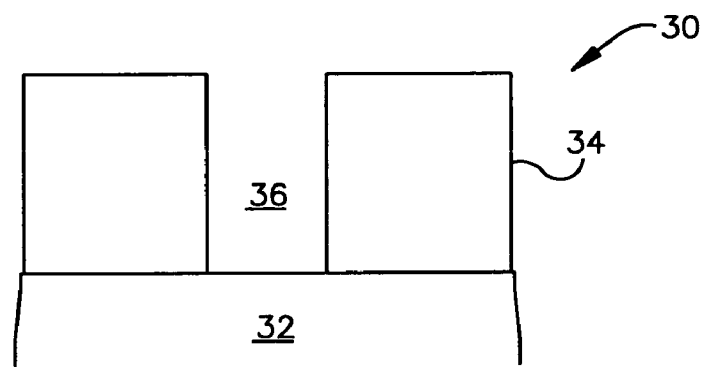
FIG. 2 illustrates a schematic cross-sectional view of a semiconductor structure having a via opening formed in a dielectric layer in accordance with an aspect of the present invention.

FIG. 2 illustrates a semiconductor structure 30 including a dielectric layer 34 which is formed on a semiconductor substrate 32. The semiconductor substrate 32 may be any suitable semiconductor material, for example, a monocrystalline silicon substrate. Any suitable technique (e.g., thermal oxidation, plasma enhanced chemical vapor deposition (CVD), thermal enhanced CVD and spin on techniques) may be employed in forming the dielectric layer 34. The dielectric layer 34 may be formed of silicon oxide (SiO), silicon dioxide ($SiO_2$), silicon nitride ($Si_3N_4$), (SiN), oxygen silicon glass (OSG), black diamond (BD-2), silicon carbon (SiC) or silicon carbon monoxide (SiCO). Other usuable dielectric materials include silicon oxynitride ($SiO_xN_y$), fluorinated silicon oxide ($SiO_xF_y$), polyimide(s), metal oxides, phosphosilicate glass (PSG), tetraethylorthosilicate (TEOS), borphosphosilicate glass (BPSG), or any other suitable glass. The present example includes a single dielectric layer for the sake of simplicity. However, it is to be appreciated that multiple dielectric layers of varying dielectric materials can be implemented to carry out the present invention.

The dielectric layer 34 includes a via opening 36 that extends from a top surface of the dielectric layer 34 to the semiconductor substrate 32 or a via stop layer. The via opening 36 is formed by anisotropically etching the dielectric layer 34 with a plasma gas(es), for example, carbon tetrafloride ($CF_4$) containing fluorine ions, in a commercially available etcher, such as a parallel plate RIE apparatus, an electron cyclotron resonance (ECR) plasma reactor, or any other plasma dry etcher, to replicate a mask pattern of a patterned photoresist layer (not shown) to thereby create the via opening 36 in the dielectric layer 34. Preferably, a selective etch technique is used to etch the material of the dielectric layer 34 at a relatively greater rate as compared to the rate that the material of the patterned photoresist (not shown).

Figure 3:
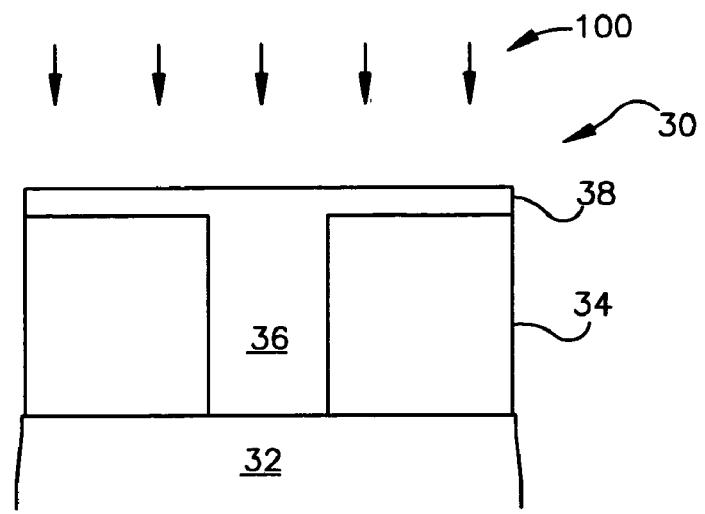
FIG. 3 illustrates a schematic cross-sectional view of the structure of FIG. 2 undergoing an etch back in accordance with an aspect of the present invention.

FIG. 3 illustrates the semiconductor structure 30 undergoing an etch back step 100 following a via fill. The semiconductor structure 30 includes an organic via fill material layer 38 that fills the via opening 36 and covers the top surface of the dielectric layer 34. Any suitable technique for forming the organic via fill material layer 38 may be employed such as Low Pressure Chemical Vapor Deposition (LPCVD), Plasma Enhanced Chemical Vapor Deposition (PECVD), High Density Chemical Plasma Vapor Deposition (HDPCVD), sputtering or high density plasma chemical vapor deposition (HDPCVD) techniques, or spin on techniques to a thickness suitable for filling the via opening 36 and covering the top surface of the dielectric layer 34. The organic via fill material is, for example, a material that has an etch rate that is at least as fast as the etch rate of the dielectric layer 34 for a given dielectric material etch chemistry.

The organic via fill material can be a polymeric material. For example, the polymeric material can be a polyester material, a cellulose material, a heterocyclic material or a methacrylate material. The polymeric material is selected to be a material that will etch at an etch rate that is within one of 60% and 20% of an etch rate of the dielectric layer 34 for a given dielectric material etch chemistry.

Figure 4:
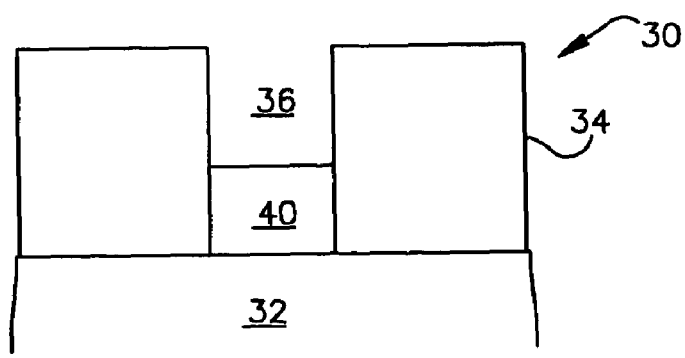
FIG. 4 illustrates a schematic cross-sectional view of the structure of FIG. 3 after the etch back in accordance with an aspect of the present invention.

The etch back step 100 (e.g., anisotropic plasma dry etch) is performed to etch back the organic via fill material layer 38 below (e.g., from about 0 to abut 5000 Å) the top surface of the dielectric layer 34 (see FIG. 4). The etch back step 100 include etching the organic via fill material layer 38 with an etch chemistry that etches the organic fill material at a relatively greater rate as compared to the rate of the underlying dielectric material layer 34. For example, the etch back step 100 can include etching the organic fill material layer 38 with an $O_2$ plasma in a mixture of argon (Ar) and/or nitrogen ($N_2$) gas. The etch back step 100 can be a timed etch, or end pointed etch. After the etch back step 100 is performed, an organic via fill material plug 40 resides in the via opening 36 below the top surface of the dielectric material layer (FIG. 4).

Figure 5:
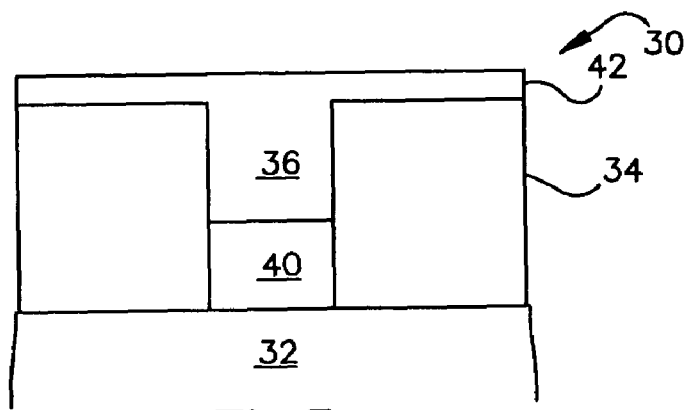
FIG. 5 illustrates a schematic cross-sectional view of the structure of FIG. 4 after deposition of a bottom anti-reflective coating (BARC) material layer in accordance with an aspect of the present invention.

FIG. 5 illustrates the semiconductor structure 30 after a BARC material layer 42 is formed over the organic via fill material plug 40 and the top surface of the dielectric layer 34. Any suitable technique for forming the BARC material layer 42 may be employed such as Low Pressure Chemical Vapor Deposition (LPCVD), Plasma Enhanced Chemical Vapor Deposition (PECVD), High Density Chemical Plasma Vapor Deposition (HDPCVD), sputtering or high density plasma chemical vapor deposition (HDPCVD) techniques or spin on techniques to a thickness suitable for filling the via opening 36 and covering the top surface of the dielectric layer 34.

The BARC material layer 42 mitigates reflections variation and further improves planarization for subsequent trench patterning of underlying layers, minimizes the effects of significant variations in reflectivities of layers and features in underlying layers, and mitigates the effects of significant variations in thickness of the underlying layers. The BARC layer 42 also mitigates deleterious affects caused by the photoresist patterning process.

The BARC material layer 42 can be formed from a polymeric material mixed with a die material or a polymeric material grafted with a die functional group. For example, the polymeric material can be a polyester material, a cellulose material, a heterocyclic material or a methacrylate material. The polymeric material is selected to be a material that will etch at an etch rate that is one of within 60% and 20% of an etch rate of the dielectric layer for a given dielectric material etch chemistry. The die material provides anti-reflective properties to the BARC material layer 42. Additionally, the BARC material may have a different viscosity than the organic fill material to improve the BARC material layers anti-reflective characteristics.

It is to be appreciated that although the BARC material and the organic fill material can be comprised of similar materials, which can be deposited in a single deposition step. However, critical dimension (CD) control and improved planarization is achieved by a separate via fill deposition, etch back of the via fill, and a BARC material deposition due to mitigating the topography that is to be planarized.

Figure 6:
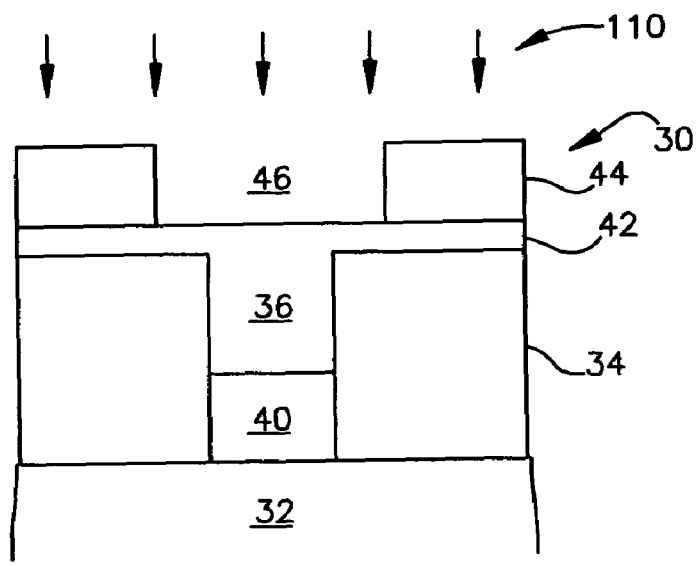
FIG. 6 illustrates a schematic cross-sectional illustration of the structure of FIG. 5 undergoing a second etch in accordance with an aspect of the present invention.

FIG. 6 illustrates a partially complete dual damascene structure undergoing a second etch step 110. The second etch step 110 (e.g., an anisotropic plasma dry etch in a RIE apparatus) is performed using a patterned photoresist material layer 44 as a mask to form a trench line 48 (FIG. 7) in the dielectric layer 34. The second etch step 110 employs an etch chemistry that etches through the BARC material layer 42 and the organic via fill material plug 40 at a rate that is substantially as fast (e.g., within 60%, within 20%) of an etch rate of the dielectric material layer 34 for a given dielectric material etch chemistry.

Figure 7:
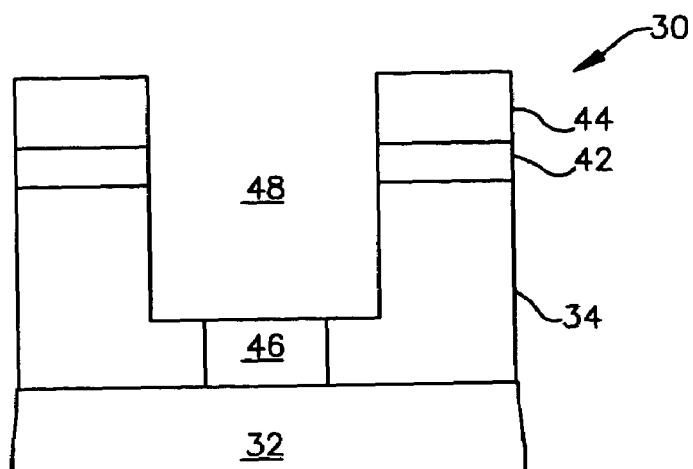
FIG. 7 illustrates a schematic cross-sectional illustration of the structure of FIG. 6 after the second etch in accordance with an aspect of the present invention.

For example, the etch chemistry can include a anisotropic etch with a plasma gas mixture of carbon tetrafluoride ($CF_4$), carbon trifluoride ($CF_3$), octafluorocyclobutane ($C_4F_8$) and oxygen ($O_2$) for a dielectric material formed from one of silicon oxide (SiO), silicon dioxide ($SiO_2$), silicon nitride ($Si_3N_4$), (SiN), silicon carbon (SiC) or silicon carbon monoxide (SiCO) with an organic fill material formed from a polymeric material such as a polyester material, a cellulose material, a heterocyclic material or a methacrylate material, and a BARC material layer formed from a polymeric material such as a polyester material, a cellulose material, a heterocyclic material or a methacrylate material. The second etch step 110 removes portions of the dielectric material 32, the BARC material layer 42 and the organic via fill material plug 40 in the via 36 to form the trench line 48 overlying a reduced organic via fill material plug 46 (FIG. 7).

Figure 8:
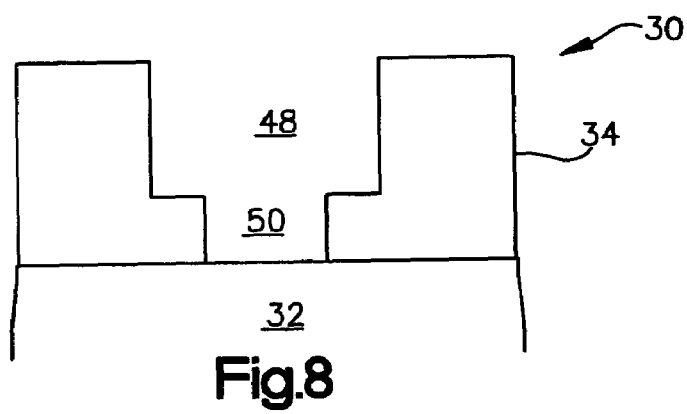
FIG. 8 illustrates a schematic cross-sectional illustration of the structure of FIG. 7 after a stripping step is substantially complete in accordance with an aspect of the present invention.

FIG. 8 illustrates a partially complete dual damascene structure 30 after a stripping step (e.g., ashing in an $O_2$ plasma) is substantially complete to remove remaining portions of the patterned photoresist layer 44, the BARC material layer 42 and the remaining portions of the reduced organic via fill material plug 46. The partially complete dual damascene structure 30 includes a via 50 and a trench line 48.

Figure 9:
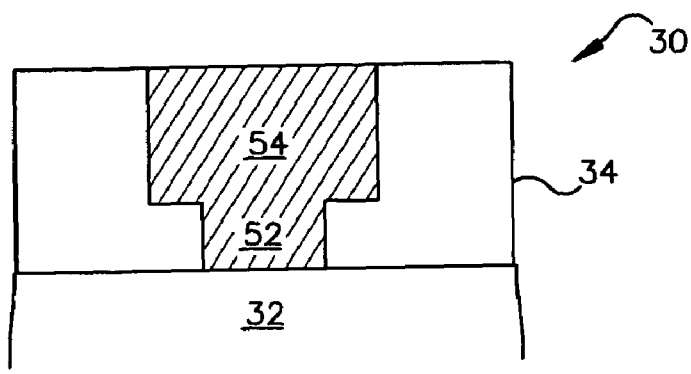
FIG. 9 is a schematic illustration of the structure of FIG. 8 after undergoing a conductive material fill and a chemical mechanical polish in accordance with the present invention.

Thereafter, as illustrated in FIG. 9, the dual damascene structure is filled with a contact material (e.g., aluminum, aluminum alloy, copper, copper alloy, tungsten, tungsten alloy) so as to form a conductive contact 52 and a conductive line 54. The metal can be polished (e.g., a chemical mechanical polish) to remove a predetermined thickness of the metal layer overlying the dielectric layer 34. Substantial completion of the polished back step results in a dual damascene structure in relevant part as illustrated in FIG. 9. Furthermore, the contact material can be removed employing a metal etch process highly selective to the contact material over the underlying dielectric layer 34.

What has been described above includes examples and implementations of the present invention. Because it is not possible to describe every conceivable combination of components, circuitry or methodologies for purposes of describing the present invention, one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A method for forming a semiconductor structure, comprising:

forming a first opening in a dielectric layer;
filling the first opening with a fill material;
etching back the fill material to form a fill material plug that resides in the first opening below a top surface of the dielectric layer; and
depositing a bottom anti-reflective coating (BARC) layer that fills the first opening above the via fill material plug and overlies at least a portion of the top surface of the dielectric layer;
then, etching a portion of the BARC layer that fills the first opening and the dielectric layer to form a second opening overlying the filled first opening with a given dielectric etch chemistry, wherein the fill material etches at an etch rate that is within 60% of an etch rate that the dielectric layer etches for the given dielectric etch chemistry.

2. The method of claim 1, wherein the first opening is a via and the second opening is a trench.

3. The method of claim 1, wherein the etching back the via fill material comprises etching the fill material with an $O_2$ plasma in mixture of at least one of argon (Ar) and nitrogen ($N_2$) gas.

4. The method of claim 1, wherein the fill material is formed from a polymeric material comprising one of a polyester material, a cellulose material, a heterocyclic material and a methacrylate material.

5. The method of claim 1, wherein the dielectric layer is formed from one of silicon oxide (SiO), silicon dioxide ($SiO_2$), silicon nitride ($Si_3N_4$), (SiN), silicon carbon (SiC), oxygen silicon glass (OSG), black diamond (BD-2) and silicon carbon monoxide (SiCO), and the given dielectric etch chemistry comprises an anisotropic etch with a plasma gas mixture of carbon tetrafluoride ($CF_4$), carbon trifluoride ($CF_3$), octafluorocyclobutane ($C_4F_8$) and oxygen ($O_2$).

6. The method of claim 1, wherein the fill material etches at an etch rate that is within 20% of an etch rate that the dielectric layer etches for the given etch chemistry.

7. The method of claim 1, wherein the BARC layer is formed from a material that etches at an etch rate that is within 60% of an etch rate that the dielectric layer etches for the given dielectric etch chemistry.

8. The method of claim 7, wherein the BARC layer is formed from a material that etches at an etch rate that is within 20% of an etch rate that the dielectric layer etches for the given dielectric etch chemistry.

9. The method of claim 7, wherein the BARC layer is formed from a polymeric material comprising one of a polyester material, a cellulose material, a heterocyclic material and a methacrylate material mixed with one of die material and a polymeric material grafted with a die functional group to provide anti-reflective properties.

10. A method for forming a dual damascene structure, comprising:
forming a via in a dielectric layer;
filling the via with an organic fill material layer;
etching back the organic via fill material to form an organic via fill material plug that resides in the via below a top surface of the dielectric layer;
depositing a bottom anti-reflective coating (BARC) layer over the dielectric layer that fills the via above the organic via fill material plug; and
anisotropically etching the BARC layer and the dielectric layer to form a trench overlying the via with a given dielectric etch chemistry, wherein the fill material etches at an etch rate that is within 60% of an etch rate that the dielectric layer etches for the given dielectric etch chemistry.

11. The method of claim 10, wherein the BARC layer is formed from a polymeric material comprising one of a polyester material, a cellulose material, a heterocyclic material and a methacrylate material mixed with one of die material and a polymeric material grafted with a die functional group to provide anti-reflective properties.

12. The method of claim 10, wherein the fill material etches at an etch rate that is within 20% of an etch rate that the dielectric layer etches for the given etch chemistry.

13. The method of claim 10, wherein the organic via fill material is formed from a polymeric material comprising one of a polyester material, a cellulose material, a heterocyclic material and a methacrylate material.

14. The method of claim 10, wherein the BARC layer is formed from a material that has an etch rate that is within 60% of an etch rate that the dielectric layer etches for the given dielectric etch chemistry.

15. The method of claim 14, wherein the BARC layer is formed from a material that has an etch rate that is within 20% of an etch rate that the dielectric layer etches for the given dielectric etch chemistry.

16. A method for forming a via-first dual damascene structure, comprising:
forming a via in a dielectric layer comprised of at least one of silicon oxide (SiO), silicon dioxide ($SiO_2$), silicon nitride ($Si_3N_4$), (SiN), oxygen silicon glass (OSG), black diamond (BD-2), silicon carbon (SiC) and silicon carbon monoxide (SiCO);
filling the via with an organic fill material layer;
etching back the organic via fill material to form an organic via fill material plug that resides in the via below a top surface of the dielectric layer;
depositing a bottom anti-reflective coating (BARC) layer over the dielectric layer that fills the via above the organic via fill material plug; and
etching a trench in the dielectric layer overlying the via with an etch chemistry comprising an anisotropic etch with a plasma gas mixture of carbon tetrafluoride ($CF_4$), carbon trifluoride ($CF_3$), octafluorocyclobutane ($C_4F_8$) and oxygen ($O_2$), wherein portions of the organic fill material and the BARC layer are also removed during the etching of the trench with said etch chemistry and wherein the organic fill material and the BARC layer have an etch rate that is within 60% of an etch rate that the dielectric layer etches for the given dielectric etch chemistry to provide a via-first dual damascene structure substantially free of etch ridges.

17. The method of claim 16, wherein the etching back the organic via fill material comprises etching the organic via fill material with an $O_2$ plasma in a mixture of at least one of argon (Ar) and nitrogen ($N_2$) gas.

18. The method of claim 16, wherein the BARC layer is formed from a polymeric material comprising one of a polyester material, a cellulose material, a heterocyclic material and a methacrylate material mixed with one of die material and a polymeric material grafted with a die functional group to provide anti-reflective properties.

19. The method of claim 16, wherein the organic via fill material is formed from a polymeric material comprising one of a polyester material, a cellulose material, a heterocyclic material and a methacrylate material.

* * * * *